(12) United States Patent
da Costa

(10) Patent No.: US 8,174,372 B2
(45) Date of Patent: May 8, 2012

(54) PROVIDING HAPTIC FEEDBACK ON A TOUCH SURFACE

(75) Inventor: Henrique D. da Costa, Montreal (CA)

(73) Assignee: Immersion Corporation, San Jose, CA (US)

( * ) Notice: Subject to any disclaimer, the term of this patent is extended or adjusted under 35 U.S.C. 154(b) by 981 days.

(21) Appl. No.: 12/146,694

(22) Filed: Jun. 26, 2008

(65) Prior Publication Data
US 2009/0322496 A1    Dec. 31, 2009

(51) Int. Cl.
*G08B 6/00* (2006.01)
(52) U.S. Cl. ............. 340/407.2; 340/407.1; 345/173
(58) Field of Classification Search ........... 340/407.2
See application file for complete search history.

(56) References Cited

U.S. PATENT DOCUMENTS

| | | | |
|---|---|---|---|
| 2003/0067449 A1* | 4/2003 | Yoshikawa et al. ........ 345/173 |
| 2004/0178996 A1 | 9/2004 | Kurashima et al. | |
| 2004/0264851 A1* | 12/2004 | Amiri ................ 385/31 |
| 2005/0017947 A1* | 1/2005 | Shahoian et al. ........ 345/156 |
| 2006/0028095 A1 | 2/2006 | Maruyama et al. | |
| 2008/0001737 A1* | 1/2008 | Metry ................ 340/540 |
| 2008/0068351 A1* | 3/2008 | Rosenberg et al. ........ 345/173 |
| 2008/0122315 A1 | 5/2008 | Maruyama et al. | |
| 2009/0160763 A1* | 6/2009 | Cauwels et al. ........ 345/156 |

FOREIGN PATENT DOCUMENTS

| WO | WO 2007/029075 A1 | 3/2007 |
| WO | WO 2008/012491 A1 | 1/2008 |
| WO | WO 2008/033710 A2 | 3/2008 |

OTHER PUBLICATIONS

PCT/US2009/043548—International Search Report and Written Opinion.

* cited by examiner

*Primary Examiner* — George Bugg
*Assistant Examiner* — Kerri McNally
(74) *Attorney, Agent, or Firm* — Squire Sanders (US) LLP

(57) ABSTRACT

Systems and methods for providing haptic feedback to a touch surface are described herein. In one embodiment, among many, a layered structure comprises a first conducting layer electrically coupled to a first terminal of a power source and a second conducting layer electrically coupled to a second terminal of the power source. The layered structure also comprises a spacing layer electrically isolating the first conducting layer from the second conducting layer. Also, an actuation layer is positioned between the first conducting layer and the second conducting layer. The actuation layer includes a material that reacts to an electrical stimulus.

40 Claims, 8 Drawing Sheets

PROVIDING HAPTIC FEEDBACK ON A TOUCH SURFACE

TECHNICAL FIELD

The embodiments of the present disclosure generally relate to touch surfaces or touch screens. More particularly, the embodiments herein relate to providing immediate haptic feedback in response to pressure applied to a touch surface or touch screen.

BACKGROUND

Haptic feedback systems are currently used to provide a haptic effect to a user of a device, e.g., an electronic device. The haptic effect is imposed on the user when a certain event occurs, such as when the user presses a button or switch or touches a portion of a touch screen by applying pressure directly with a finger or indirectly using a stylus or other similar device. The haptic feedback can be used as a verification to the user that the user's input has been received, which can improve the quality of the user interface experience.

Typically, sensors are used to measure the pressure that the user applies to the surface. A control program running on a microprocessor evaluates the magnitude of the measured pressure and the location where the touch screen has been pressed. From this evaluation, the control program can determine when to provide haptic feedback and the nature of the haptic feedback. When the control program determines that haptic feedback is to be provided, it transmits a signal to haptic feedback hardware that is designed to provide the haptic response to the user.

SUMMARY

The embodiments described herein include various implementations of systems and methods for providing haptic feedback to a touch surface. One embodiment of a layered structure is described in which a first conducting layer is electrically coupled to a first terminal of a power source. The layered structure also includes a second conducting layer electrically coupled to a second terminal of the power source. In addition, the layered structure comprises a spacing layer electrically isolating the first conducting layer from the second conducting layer. The layered structure also includes an actuation layer, which is positioned between the first conducting layer and the second conducting layer, and which includes a material that reacts to an electrical stimulus.

The embodiments described in the present disclosure may include additional features and advantages, which may not necessarily be expressly disclosed herein but will be apparent to one of ordinary skill in the art upon examination of the following detailed description and accompanying drawings. It is intended that these additional features and advantages be included within the present disclosure.

BRIEF DESCRIPTION OF THE DRAWINGS

The components of the following figures are illustrated to emphasize the general principles of the present disclosure and are not necessarily drawn to scale. Reference characters designating corresponding components are repeated as necessary throughout the figures for the sake of consistency and clarity.

DETAILED DESCRIPTION

Figure 1:
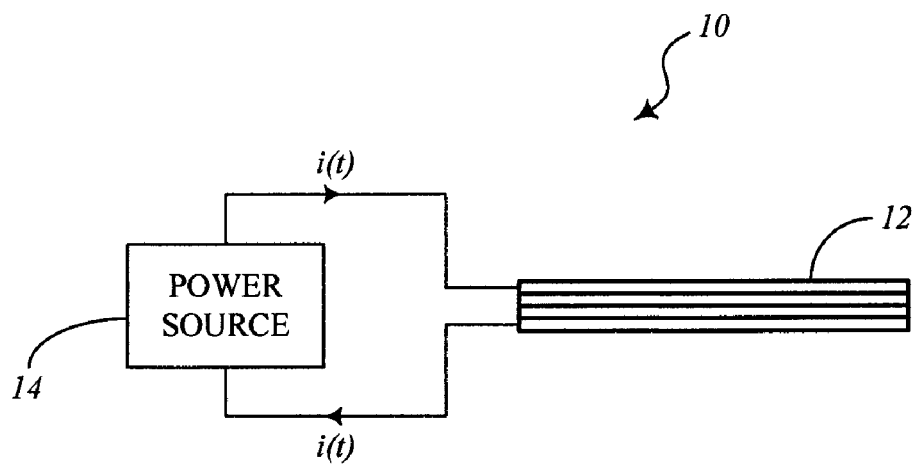
FIG. 1 is a diagram illustrating a direct haptic feedback system according to a first embodiment.

In conventional haptic feedback systems used in conjunction with a touch screen, a first portion of the system that senses touch is separate from a second portion that provides the tactile feedback. Normally, when a user touches a touch screen, a signal is sent to a microprocessor, which determines where the screen has been touched and determines what kind of tactile feedback to provide. The microprocessor then sends a signal to an actuator, such as a motor or other electromechanical device, for providing tactile feedback.

However, by including a sensor and microprocessor in the haptic feedback process, a minimum latency is inherent. The time that it takes for pressure information to be communicated from the sensors to the microprocessor, pressure information to be processed by the control program, and haptic feedback to be communicated from the microprocessor to the haptic feedback hardware defines a latency that should not be ignored. Latency should be kept to a minimum in order for the user to feel the haptic response in a timely fashion. Delays of more than about 50 milliseconds or so become noticeable and negatively impact the user's experience.

In addition, the need for a microprocessor to provide haptic feedback adds cost to the system. By reducing or eliminating the need for a microprocessor, at least for providing an initial haptic feedback, latency can be significantly reduced. In particular, as explained with respect to the embodiments of the present disclosure, the operations of sensing and providing feedback can be connected together. Therefore, when a user touches the touch screen, tactile feedback is immediately provided to the user without the intervention of a microprocessor.

The embodiments of the present disclosure describe haptic feedback systems that can be used in conjunction with any suitable type of touch surface or touch screen device. The touch surfaces described herein include a number of layers formed on top of each other, and formed and bonded using in any suitable manufacturing techniques. In general, the layered structures are formed such that conductive layers are located on or near the top and on or near the bottom of the structure. However, the layered structures are also formed with a spacing layer such that, when no pressure is being applied, a space or gap is maintained between two electrically conductive or semi-conductive layers. Therefore, the layered structures are considered to be open circuit devices with respect to current flow in a direction substantially perpendicular to the substantially flat layers or top and bottom surfaces of the structures.

When a portion of the layered structure is pressed using sufficient pressure, the layers normally separated by the gap formed by the spacing layer are brought into contact with each other. In a sense, the normally opened circuit is closed or completed, similar to the closing of a switch. A power source is connected to the layered structure to provide electrical current or voltage to the layered structure. However, with the layered structure in the normally open state, the circuit comprising the power source and layered structure is not complete. When pressure is applied, the layered structure becomes electrically conductive such that current can flow through the structure in the substantially perpendicular direction.

The layered structure further includes an actuation layer, which comprises a material that reacts to an electrical current flowing through it. In response to the current, the actuation layer vibrates, changes shape, size, or thickness, or reacts in some other manner. The actuation layer may contain a piezoelectric material or other material that can provide some type of haptic effect when current is applied. In some embodiments, the actuation layer may comprise miniature electromechanical components for providing localized haptic feedback.

When the normally open circuit is completed by the pressure-applied closing of the spacing layer gap, an initial and immediate actuation of the actuation layer occurs. The power source is allowed to provide power through the layered structure and the initial actuation of the actuation layer can be sufficiently strong to allow the user to sense the movement of the actuation layer. The power source can continue to provide power to the actuation layer as long as pressure is being applied. In other embodiments, however, a controller can be used to modify the initial actuation to cause a predetermined decay of the haptic effect envelope.

Another aspect to be determined with respect to a number of embodiments is how to sense where a touch screen is being touched. Although some technology for touch screens already exists, the present disclosure further describes embodiments in which immediate haptic feedback is provided while the touch location is also determined.

Because tactile feedback is directly and locally triggered in the present embodiments, the latency, or time between the user pressing a surface of the layered structure and receiving tactile feedback, is minimized. The embodiments described herein do not necessarily rely on a control program running on a microprocessor and may therefore be less expensive to implement. The layered structure may be configured to further include touch sensing capabilities, which may eliminate the need for additional touch sensing hardware.

The embodiments of the layered structures described herein may include any suitable combination of protective layers, conductive layers, spacing layers, actuation layers, support layers, etc. The actuation layers may include conductive layers or in other embodiment may include semi-conductive layers. In some embodiments, the layered structure may be divided into regions such that each region may be independently activated by the user. The regions may be arranged in a grid or other suitable pattern. Also, a controller may be used to create different haptic effects based on the different regions being touched or pressed.

With respect to the embodiments disclosed in FIGS. 1, 2, 10, and 12, a signal i(t) is shown and described as a sinusoidal alternating current ("AC"). However, it should be noted that the signal i(t) can also include any suitable type of AC or direct current ("DC") current, AC or DC voltage, electric field, electrical charge, or other electrical stimulus. Also, it should also be noted that the signal i(t) can vary over time or can be constant.

In addition, several the embodiments of the present disclosure describe a user applying pressure to a top surface of a layered structure. However, it should be noted that the top and bottom positions are merely related to the illustrated examples, but in reality the layers of the layered structures may be oriented in any configuration. It should also be noted that the pressure may be applied by a human, an animal, or even a non-living object. When pressure is applied by a human, for example, the user may apply pressure directly with a finger or other part of the body. Alternatively, the user may use a stylus or other mechanical instrument for applying pressure. In addition, the pressure can be applied on either or both of the top and bottom surfaces of the layered structure. In some embodiments, the layered structure may be placed in an environment in which the pressure applied to its surface or surfaces is an atmospheric pressure caused by a difference in air pressure between the inside and outside of the structure.

Many of the layers of the layered structures can be flexible, thereby allowing a pressure applied to a surface of the structure to cause one or more of the layers to bend in such a way as to bridge the electrically isolated gap formed by the spacing layer. On the other hand, the support layers described in the embodiments below may include any rigid or relatively inflexible material located at the top and/or bottom of the structure to provide support for the structure. In some embodiments, the layers may contain translucent or transparent materials.

FIG. 1 illustrates a first embodiment of a direct haptic feedback system 10. In this embodiment, direct haptic feedback system 10 includes a layered structure 12 and a power source 14. Layered structure 12 include a number of layers having electrically conductive or semi-conductive properties to allow current to flow through the layers. However, of the multiple layers, one layer is a spacing layer that separates, and thereby electrically isolates, two of the adjacent conductive or semi-conductive layers. When no pressure is applied, the spacing layer keeps two adjacent layers apart. When pressure is applied to the top layer of layered structure 12, such as from a person pressing down on the top layer with their finger, the top layer or layers are configured to bend such that the adjacent layers that are normally separated by the spacing layer are brought into contact with each other to close the circuit. In this sense, the pressure applied to the top of layered structure 12 closes the normally-open circuit.

Power source 14 is capable of providing a current signal i(t) to one layer, e.g., a top layer, of layered structure 12 and receiving a return current signal i(t) from another layer, e.g., a bottom layer, of layered structure 12. When no pressure is applied to layered structure 12 and the spacing layer keeps the device in an open circuit condition, current i(t) does not flow through layered structure 12. However, when pressure is applied to layered structure causing the normally separated conductive layers to be in electrical contact, then current i(t) is allowed to flow through layered structure 12. Power source 14 could supply a sinusoidal voltage at all times. When pressure is applied, a sinusoidal current is allowed to flow through layered structure 12 causing the actuation layer to vibrate, expand and contract, or react in some other suitable manner enabling the user to physically sense the haptic or tactile feedback. The frequency of the sinusoidal signal may be about 100-200 Hz, depending on the resonance characteristics of the actuation layer material.

Furthermore, one of the layers of layered structure 12 is an actuation layer, which reacts to the current flowing through layered structure 12. Particularly, the actuation layer may include a piezoelectric material that vibrates or changes thickness in response to the application of a sinusoidal signal. Therefore, in operation, direct haptic feedback system 10 can provide an immediate haptic effect when the user first presses the top layer of layered structure 12. By pressing the top layer with sufficient pressure to electrically bridge the spacing layer, the current i(t) from power source 14 flows through layered structure 12 and stimulates the electrically sensitive actuation layer. In response, the actuation layer vibrates to provide an immediate sensation to the user while pressing on the top layer.

Figure 2:
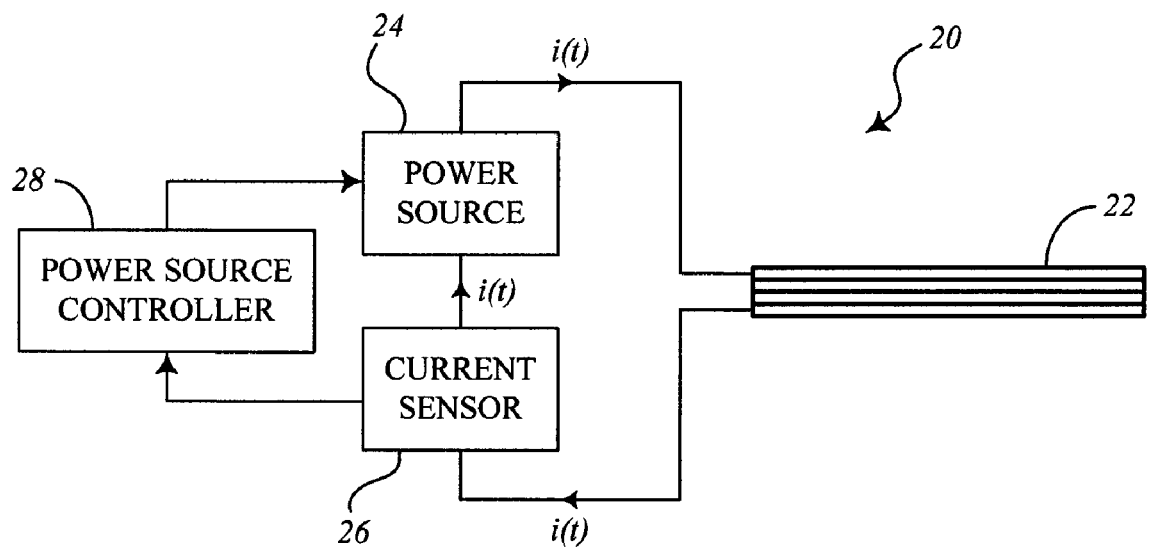
FIG. 2 is a diagram illustrating a direct haptic feedback system according to a second embodiment.

FIG. 2 illustrates a second embodiment of a direct haptic feedback system 20. In this embodiment, direct haptic feedback system 20 includes a layered structure 22 and a power source 24 similar to the embodiment of FIG. 1. In addition, however, direct haptic feedback system 20 includes a current sensor 26 and a power source controller 28. Current sensor 26 is placed in the loop of the normally opened circuit that also contains layered structure 22 and power source 24. When sufficient pressure is applied to the top of layered structure 22, the circuit closes and current flows through the loop. The current through the actuation layer creates an initial haptic effect that the user can sense. Meanwhile, current sensor 26 is configured to sense when current flows through the loop.

When current sensor 26 detects current, it sends a signal to power source controller 28 to indicate that a current has been detected. In response, power source control 28 controls power source 24 in such a way to cause it to modify its output signal. Particularly, in order to provide a sensation to the user of a regular switch or button, a haptic effect should be applied in a specific manner. Therefore, power source controller 28 can control power source 24 to create any suitable output envelope after the initial stimulation. The output envelope, for example, may include a signal that stops after a certain amount of time, decays until the magnitude of the current signal i(t) is zero, or any other predetermined modification that results in any type of change to i(t) for any predetermined length of time.

With the configuration illustrated in FIG. 2, the haptic feedback can be provided for a predetermined length of time and not continue indefinitely, thereby making the sensation feel more like a regular button or switch. Otherwise, if the haptic signal is continued for as long as the user presses on the top layer, the haptic signal can seem excessive or unnatural. In order to replicate the feeling of a switch, power source controller 28 may be configured to control the power source 24 to maintain a vibration for about 30 milliseconds. Even if the user presses for a longer time, direct haptic feedback system 20 can be configured such that layered structure 22 does not keep vibrating, which may be unpleasant to the user and would not feel like a mechanical button or switch.

In some embodiments, layered structure 22 can be configured to include multiple regions that can be pressed. Thus, current sensor 26 could be configured to detect any current flow along any route through layered structure 22. If the multiple regions are configured with different sizes, then current sensor 26 could be configured to detect the magnitude of the current in order to distinguish between the different sizes. In this way, power source controller 28 can be configured to determine which region of layered structure 22 was pressed. As a result, power source controller 28 may cause power source 24 to provide different haptic feedback patterns based on the particular regions pressed.

In operation, power source 24 applies a sinusoidal excitation to layered structure 22, which does not actually flow through the structure until the pressure is applied. Current sensor 26 waits for the time when the circuit is complete, caused by the applied pressure bridging the spacing layer gap. While current sensor 26 detects that the current is flowing, the actuation layer within layered structure 22 already begins to vibrate to start an initial haptic sensation powered by the sinusoidal excitation. Current sensor 26 informs power source controller 28 of a magnitude of current sensed or merely that a current has been sensed. In response, power source controller 28 sends a control signal to power source 24 to apply a suitable signal decaying envelope to the existing sinusoidal excitation. Alternatively, power source 24 can apply some other signal to give the sensation of a mechanical switch or some other suitable signal pattern having any suitable duration. In this respect, latency is not an issue since the user receives the initial haptic feedback immediately, which may be modified after a normal processing delay.

FIGS. 3-7 are diagrams illustrating cross-sectional side views of several embodiments of layered structures. The layered structures of FIGS. 3-7 may be used in place of the examples of layered structure 12 shown in FIG. 1, layered structure 22 shown in FIG. 2, the layered structures shown in FIGS. 8-12, or in any other suitable direct haptic feedback systems. The layered structures can include any number or type of layers. Specifically, the layered structures may include one or more protective layers, two or more conductive layers, one or more spacing layers, and one or more actuation layers. In some embodiments, the actuation layer and/or a third conductive layer may be configured as sectional layers having multiple regions that are electrically isolated from each other. The different regions can correspond, for example, to various locations where a user can press, thereby allowing the layered structure to provide haptic feedback when any one of an array of "button" or regions are pressed. By separating the regions, different types of haptic feedback can be provided for each of the different regions.

The protective layers can be formed of flexible or rigid material, depending on the particular need. Since these layers are intended to be contacted by the user or by another instrument, the protective layers may comprise a material to provide durability and rigidity to withstand numerous contacts and various environmental conditions. The protective layers can provide structural integrity and a certain amount of stiffness, and also can electrically insulate the other layers from external electrical fields. The protective layers may include a film, veneer, or other insulation material or structure that protects and electrically insulates the conducting layers from the environment or from other layers.

The protective layers may serve cosmetic purposes and/or can include letters, numerals, symbols, or characters that provide an indication to the user of where to press to enter certain input information. The protective layers may be formed on the top and/or bottom of the stack of layers to provide support where needed. Also, depending on whether the layered structure is used with another device or incorporated with another device, such as a layered touch sensitive device or display device, the protective layers may not be necessary and can be omitted. In some cases, the protective layers can be flexible enough to allow a pressure on one side of the layered structure to be translated to the opposite side for the benefit of an adjacent touch sensitive device.

The conducting layers comprise any suitable flexible, electrically conducting material or structure configured to connect to an external power supply. Conducting layers may be connected to power source 14, 24 or current sensor 26 for electrically conducting current between the other parts of the layered structure and the power source. In some embodiments, the layered structure comprises two conducting layers, one which is connected to a first terminal of power source 14, 24 and one which is connected to a second terminal of power source 14, 24. The conducting layers provide the current signal i(t) through the layered structure when the circuit is completed. In some embodiments, the conducting layers can be separated from other layers by the spacing layer to form the electrically open circuit until pressure is applied.

The spacing layer is a space or gap comprising air, gas, or fluid material that can be easily displaced to allow contact between the normally separated conducting layers and/or actuation layers. The spacing layer may contain certain insulating structures to ensure that a predetermined spacing is maintained between layers to keep the circuit in an open circuit condition. Such structures may be made of compressible material and may allow a conducting layer to contact more than one region of a multiple region layer when pressure is applied at multiple locations on the surface of the structure.

The actuation layer and/or a third conductive layer positioned between the other two conductive layers can comprise, in some embodiments, a two-dimensional grid of regions in which each region includes an electrically conducting material or structure electrically insulated from the other regions by an insulating material or structure. The sectioned layers, in other embodiments, may contain a single region (1×1 grid). When a conductive layer or actuation layer touches one or more regions of the sectioned layer, a closed electric circuit is established and current can flow through the actuation layer at these one or more regions. In this way, the haptic feedback can be focused at the location where the layered structure is actually pressed. The sectioned layer may be considered as an additional conductive layer, e.g., third conductive layer, for allowing a substantially uniform conduction of current through the actuation layer. This additional conductive layer may include isolated regions for allowing the haptic effect to be focused on merely the general area where the device is pressed.

The actuation layers comprises a material or construction that results in haptic or tactile feedback when a drive signal is applied and electric current flows through the material or construction. The actuation layer may be configured to react to any type of electrical stimulus, such as, for example, current, voltage, electrostatic charge, electric field, etc. For example, the actuation layer can be a piezoelectric material, electro-active polymer, long molecule polymer, liquid crystal, or other suitable material whose polarity, shape, size, thickness, or other physical characteristics change in response to the electrical stimulus. The actuation layer may be sectioned into a number of regions for actuation of only one or more of the regions as needed. In some embodiments, the actuation layer may include one or more micromechanical devices for providing a mechanical movement when activated. The actuation layers can be conductive or semi-conductive, allowing current to flow through at least a portion of the layer when the circuit is completed. For example, in the embodiments of FIGS. 3-7, the actuation layers may be semi-conductive, such that current primarily flows through the areas where contact is made between the actuation layer and the adjacent layers. In addition, the embodiments of FIGS. 3, 6, and 7 are configured such that the actuation layers can be conductive, such that current primarily flows through the majority of the actuation layer or, if sectioned in regions, the majority of the region or regions that receive the electrical stimulus.

The order of the layers can be changed according to design or need. In some cases, it may be desirable to require the fewest number of layers to be bent by the pressure in order that the layered structure can be more touch sensitive. In other cases, it may be desirable to provide the actuation layer closer to where the user touches the touch screen in order that the layered structure can provide haptic feedback that can be more easily sensed by the user. Also, by positioning the actuation layer closer to the actual location where the structure is pressed, the haptic feedback may be sensed more strongly. Various embodiments of the layered structures are described in more detail below with respect to FIGS. 3-7.

FIGS. 3A-3D illustrate a first set of embodiments in which only two conductive layers are included. In these embodiments, no sectional layer is included. The embodiments of FIG. 3 may be used as a single "button" or single region that can be pressed anywhere on the top surface. In this case, each of the actuation layers comprises a conductive material that evenly distributes current throughout the entire actuation layer. The embodiments of FIG. 3 may also be used as multiple buttons or regions that can be pressed. In this case, the actuation layers comprises a material that is not highly conductive, such as a semi-conductive material that does not distribute current throughout the actuation layer but rather is configured to allow current through the path of least resistance to the nearest contact with other adjacent layers. Thus, the actuation layer only reacts at the general location or region where the layered structure is pressed.

FIG. 3 illustrates diagrams of layered structures 30 comprising a first conductive layer 32, a second conductive layer 34, an actuation layer 36, and a spacing layer 38. In FIG. 3A, layered structure 30a comprises, from top to bottom, first conductive layer 32, spacing layer 38, actuation layer 36, and second conductive layer 34. In FIG. 3B, layered structure 30b comprises, from top to bottom, first conductive layer 32, actuation layer 36, spacing layer 38, and second conductive layer 34.

Figure 3A:
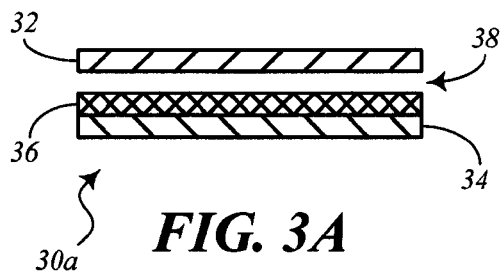
FIGS. 3A-3D are diagrams illustrating a cross-sectional side view of examples of the layered structure shown in FIG. 1 or FIG. 2 according to a first set of embodiments.
Figure 3B:
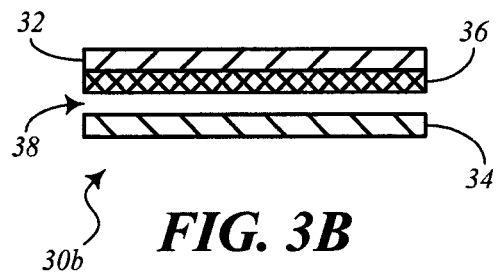
Figure 3C:
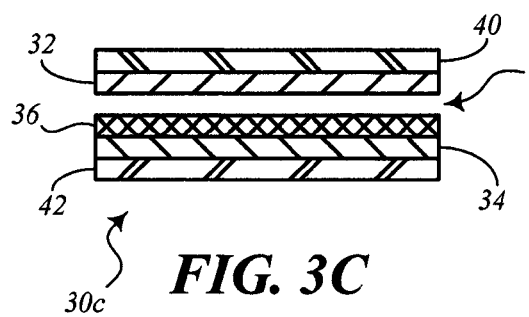
Figure 3D:
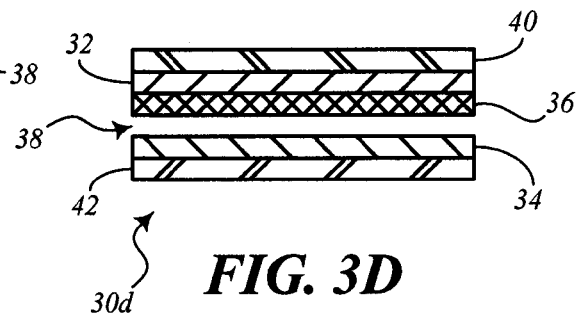

FIGS. 3C and 3D further include first protection layer 40 and second protection layer 42. In some embodiments, one of the protection layers can be omitted, depending on the particular design. In FIG. 3C, layered structure 30c comprises, from top to bottom, first protective layer 40, first conductive layer 32, spacing layer 38, actuation layer 36, second conductive layer 34, and second protection layer 42. In FIG. 3D, layered structure 30d comprises, from top to bottom, first protective layer 40, first conductive layer 32, actuation layer 36, spacing layer 38, second conductive layer 34, and second protection layer 42.

FIGS. 4A-4D illustrate a second set of embodiments in which three conductive layers are included and the layered structure are configured to be used as a single button or region that can be pressed. The two outer conductive layers are connected to power source 14, 24. Since an additional conductive layer is added and sandwiches the actuation layer between two conductive layers, the actuation layer can include a conductive material or semi-conductive material. Either way, current will flow evenly throughout the actuation layer.

FIG. 4 illustrates diagrams of layered structures 44 comprising first conductive layer 46, second conductive layer 48, third conductive layer 50, actuation layer 52, and spacing layer 54. In FIG. 4A, layered structure 44a comprises, from top to bottom, first conductive layer 46, spacing layer 54, third conductive layer 50, actuation layer 52, and second conductive layer 48. In FIG. 4B, layered structure 44b comprises, from top to bottom, first conductive layer 46, actuation layer 52, third conductive layer 50, spacing layer 54, and second conductive layer 48.

Figure 4A:
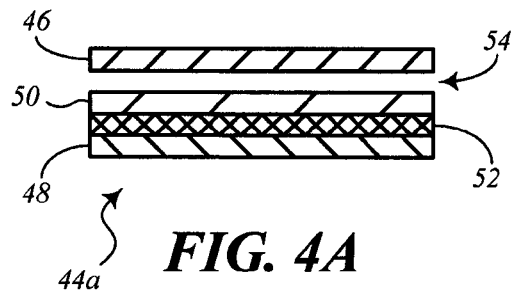
FIGS. 4A-4D are diagrams illustrating a cross-sectional side view of examples of the layered structure shown in FIG. 1 or FIG. 2 according to a second set of embodiments.
Figure 4B:
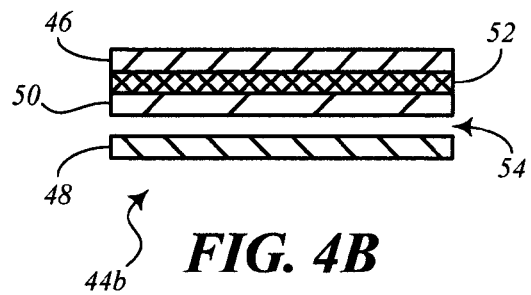
Figure 4C:
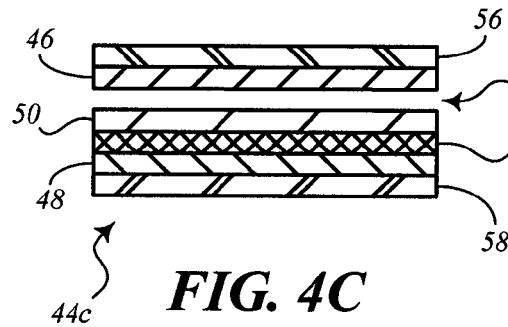
Figure 4D:
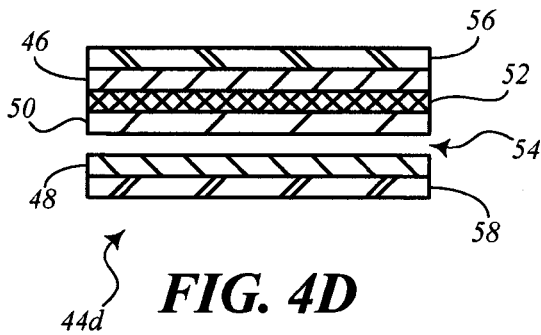

FIGS. 4C and 4D further include first protection layer 56 and second protection layer 58. In some embodiments, one of the protection layers can be omitted, depending on the particular design. In FIG. 4C, layered structure 44c comprises, from top to bottom, first protection layer 56, first conductive layer 46, spacing layer 54, third conductive layer 50, actuation layer 52, second conductive layer 48, and second protection layer 58. In FIG. 4D, layered structure 44d comprises, from top to bottom, first protection layer 56, first conductive layer 46, actuation layer 52, third conductive layer 50, spacing layer 54, second conductive layer 48, and second protection layer 58.

FIGS. 5A-5D illustrate a third set of embodiments in which three conductive layers are included. Also FIG. 5 is designed with sectional regions to define multiple buttons or regions that can be pressed. Because of the conductivity of certain layers, electrically insulating material is used to isolate the different regions from each other. The isolation also helps to maintain the reaction of the actuation layer in a confined area. Otherwise, a greater amount of power would be needed to properly activate the actuation layer.

FIG. 5 illustrates diagrams of layered structures 62 comprising first conductive layer 64, second conductive layer 66, third conductive layer 68, actuation layer 70, and spacing layer 72. Insulating material 74 is used to separate different regions of third conductive layer 68 from each other. In FIG. 5A, layered structure 62a comprises, from top to bottom, first conductive layer 64, spacing layer 72, third conductive layer 68, actuation layer 70, and second conductive layer 66. In FIG. 5B, layered structure 62b comprises, from top to bottom, first conductive layer 64, actuation layer 70, third conductive layer 68, spacing layer 72, and second conductive layer 66.

Figure 5A:
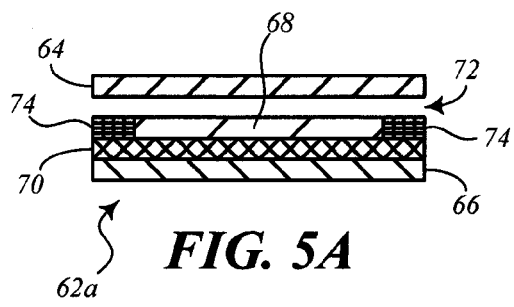
FIGS. 5A-5D are diagrams illustrating a cross-sectional side view of examples of the layered structure shown in FIG. 1 or FIG. 2 according to a third set of embodiments.
Figure 5B:
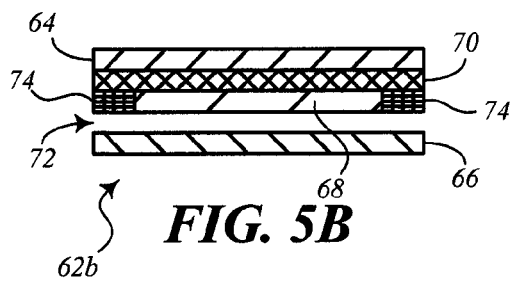
Figure 5C:
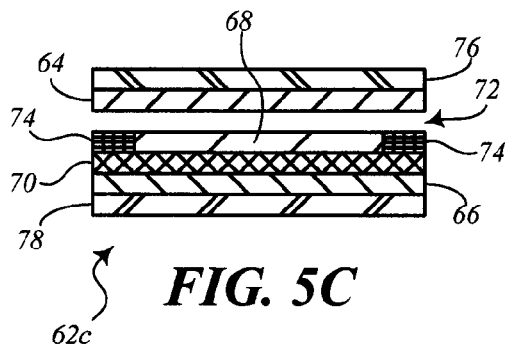
Figure 5D:
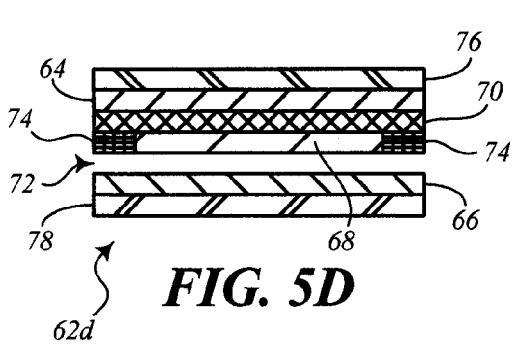

FIGS. 5C and 5D further include first protection layer 76 and second protection layer 78. In some embodiments, one of the protection layers can be omitted, depending on the particular design. In FIG. 5C, layered structure 62c comprises, from top to bottom, first protection layer 76, first conductive layer 64, spacing layer 72, third conductive layer 68, actuation layer 70, second conductive layer 66, and second protection layer 78. In FIG. 5D, layered structure 62d comprises, from top to bottom, first protection layer 76, first conductive layer 64, actuation layer 70, third conductive layer 68, spacing layer 72, second conductive layer 66, and second protection layer 78.

FIGS. 6A-6F illustrate a fourth set of embodiments in which three conductive layers are included. Also FIG. 6 is designed with sectional regions to define multiple buttons or regions that can be pressed. Because of the conductivity of certain layers, electrically insulating material may be used as necessary to isolate the different regions from each other. The isolation also helps to maintain the reaction of the actuation layer in a confined area. Otherwise, in some cases, a greater amount of power might be needed to properly stimulate the actuation layer.

The actuation layer can include a conductive or semi-conductive material according to the particular design. Since the actuation layer of FIG. 6 includes sectional regions that correspond with the sectional regions of a third conductive layer, actuation of the actuation layer is confined to the particular region that corresponds to the location that was pressed. Therefore, with this isolation created by the insulating material between the different regions of the actuation layer, the actuation layer can include a conductive material and still be isolated from the other regions. However, if the actuation layer is semi-conductive, activation is confined to the portion through which current flows, except for FIGS. 6A and 6E, which include a configuration that includes the actuation layer sandwiched between the third conductive layer and another conductive layer. Thus, current through the actuation layer is distributed substantially evenly, regardless of whether the actuation layer is conductive or semi-conductive.

FIG. 6 illustrates diagrams of layered structures 80 comprising first conductive layer 82, second conductive layer 84, third conductive layer 86, actuation layer 88, and spacing layer 90. Insulating material 92 is used to separate different regions of third conductive layer 86 from each other and to separate corresponding different regions of actuation layer 88. Although protective layers are not illustrated in FIG. 6, it should be noted that one or more protective layers can be applied to the top and/or bottom as needed.

Figure 6A:
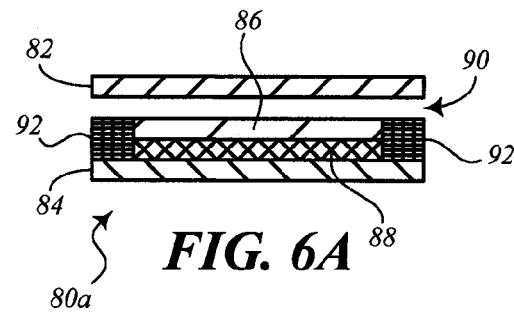
FIGS. 6A-6F are diagrams illustrating a cross-sectional side view of examples of the layered structure shown in FIG. 1 or FIG. 2 according to a fourth set of embodiments.
Figure 6B:
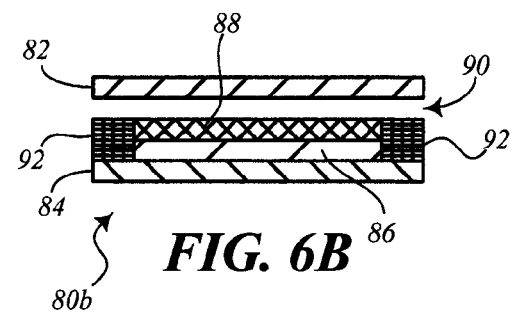
Figure 6C:
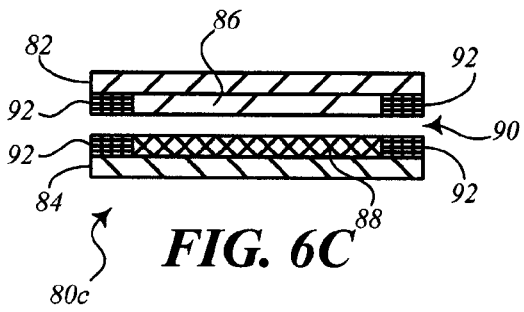
Figure 6D:
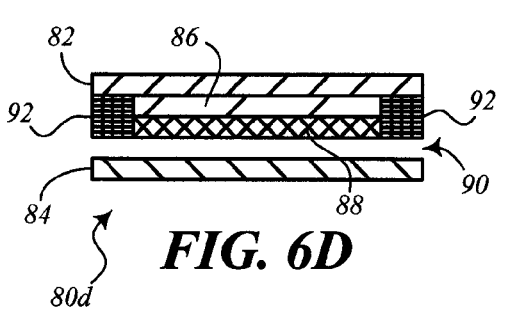
Figure 6E:
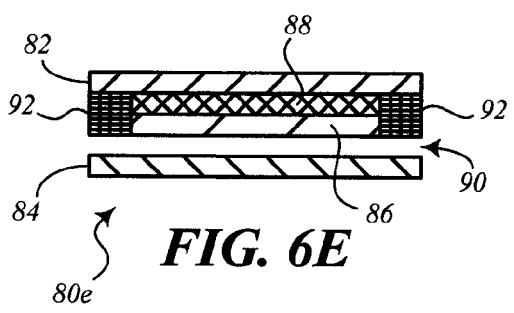
Figure 6F:
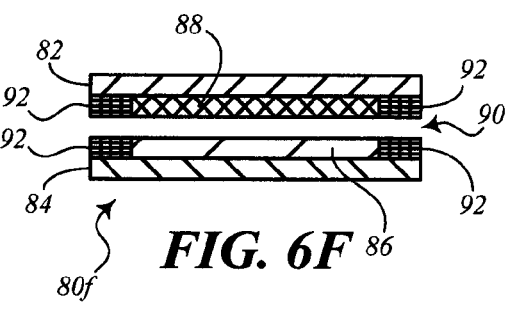

In FIG. 6A, layered structure 80a comprises, from top to bottom, first conductive layer 82, spacing layer 90, third conductive layer 86, actuation layer 88, and second conductive layer 84. In FIG. 6B, layered structure 80b comprises, from top to bottom, first conductive layer 82, spacing layer 90, actuation layer 88, third conductive layer 86, and second conductive layer 84. In FIG. 6C, layered structure 80c comprises, from top to bottom, first conductive layer 82, third conductive layer 86, spacing layer 90, actuation layer 88, and second conductive layer 84. In FIG. 6D, layered structure 80d comprises, from top to bottom, first conductive layer 82, third conductive layer 86, actuation layer 88, spacing layer 90, and second conductive layer 84. In FIG. 6E, layered structure 80e comprises, from top to bottom, first conductive layer 82, actuation layer 88, third conductive layer 86, spacing layer 90, and second conductive layer 84. In FIG. 6F, layered structure 80f comprises, from top to bottom, first conductive layer 82, actuation layer 88, spacing layer 90, third conductive layer 86, and second conductive layer 84.

FIGS. 7A-7D illustrate a fifth set of embodiments in which only two conductive layers are included. The third conductive layer is not used in these embodiments. Also FIG. 7 is designed with sectional regions to define multiple buttons or regions that can be pressed. Because of the conductivity of certain layers, electrically insulating material is used to isolate the different regions from each other. The isolation also helps to maintain the reaction of the actuation layer in a confined area. Otherwise, a greater amount of power would be needed to properly activate the actuation layer.

FIG. 7 illustrates diagrams of layered structures 96 comprising first conductive layer 98, second conductive layer 100, actuation layer 102, and spacing layer 104. Insulating material 106 is used to separate different regions of actuation layer 102 from each other. In FIG. 7A, layered structure 96a comprises, from top to bottom, first conductive layer 98, spacing layer 104, actuation layer 102, and second conductive layer 100. In FIG. 7B, layered structure 96b comprises, from top to bottom, first conductive layer 98, actuation layer 102, spacing layer 104, and second conductive layer 100.

Figure 7A:
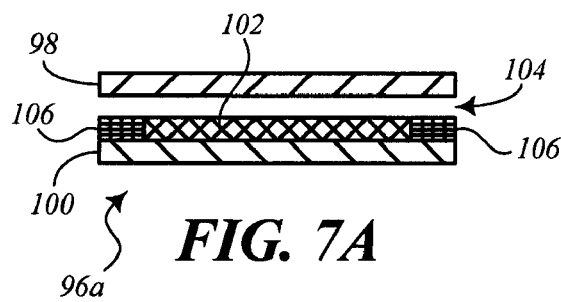
FIGS. 7A-7D are diagrams illustrating a cross-sectional side view of examples of the layered structure shown in FIG. 1 or FIG. 2 according to a fifth set of embodiments.
Figure 7B:
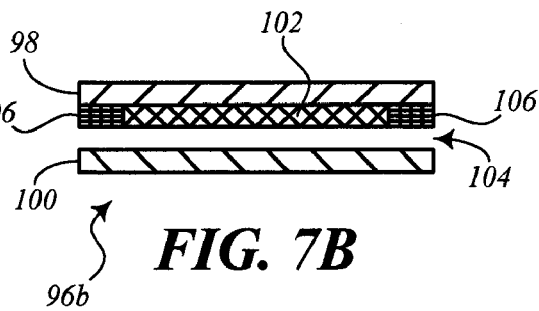
Figure 7C:
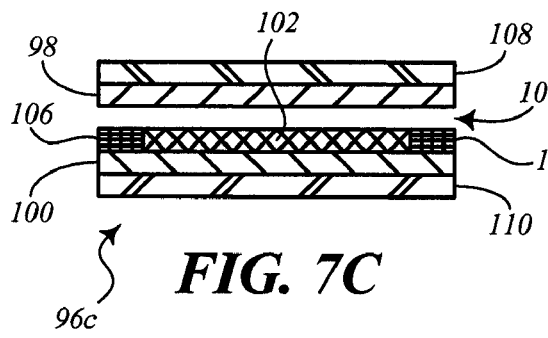
Figure 7D:
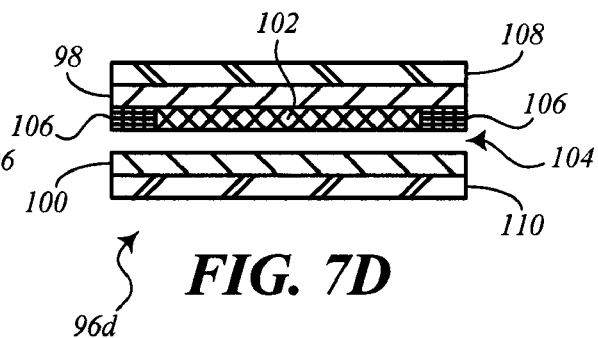

FIGS. 7C and 7D further include first protection layer 108 and second protection layer 110. In some embodiments, one of the protection layers can be omitted, depending on the particular design. In FIG. 7C, layered structure 96c comprises, from top to bottom, first protection layer 108, first conductive layer 98, spacing layer 104, actuation layer 102, second conductive layer 100, and second protection layer 110. In FIG. 7D, layered structure 96d comprises, from top to bottom, first protection layer 108, first conductive layer 98, actuation layer 102, spacing layer 104, second conductive layer 100, and second protection layer 110.

Each region, or cell, that can be independently selected and activated may receive an independent drive signal such that different tactile feedback is applied in different regions on the touch surface. In the same manner, certain regions may be excluded from providing tactile feedback at certain times.

In some embodiments, the third conductive layers and/or activation layers are constructed so that the surface is divided into small regions. All other layers can be formed of one continuous material. In this respect, the sectioned layers may be localized. When a user applies pressure to one or more of the sections of the sectioned layers in a certain area, current flows through the portion or portions of the actuation layer where pressure is applied and thus vibration occurs only where it is pressed. On the other hand, if these layers are not separated into sections, the layers may be configured such that current flows through the entire activation layer. Then, vibration would occur across the entire layered structure regardless of where the user presses. In this scenario, more power than normally needed would have to be used. Therefore, by separating one or more layers into sections, the electrical current can be localized and vibration is focused where the user presses.

In the embodiments in which actuation is limited to certain divided regions, it should be noted that more than one region can be actuated at the same time. For example, each region may have an area that is smaller than the actual area that receives compression by the user's finger or pressure applying device. In this case, multiple contiguous regions can be actuated simultaneously when the user applies pressure to the top layer. It may also be possible for a user to apply pressure at two or more non-contiguous areas on the top layer. For example, the user may press two or more "buttons" simultaneously, thereby resulting in the actuation, e.g. vibration, at the two or more locations at the same time.

According to another usage scenario, a user might swipe his or her finger (or other pressure applying device) over the top surface of the layered structure. With multiple actuation regions, the user should be able to sense the immediate actuation at the multiple points along the swipe. In embodiments where a power source controller, e.g., power source controller 28 (FIG. 2), is used in a direct haptic feedback system, the power source controller may be configured to sense when the user is applying a swiping-type pressure. If a swiping action is detected, the power source controller may control the power source, e.g., power source 24, to create a unique haptic effect. In some embodiments, the power source may even anticipate the actuation regions that may be pressed if the swiping action continues in a predictable direction and actuate those regions in the path of the swipe to thereby provide direct haptic feedback in a timely manner.

Figure 8:
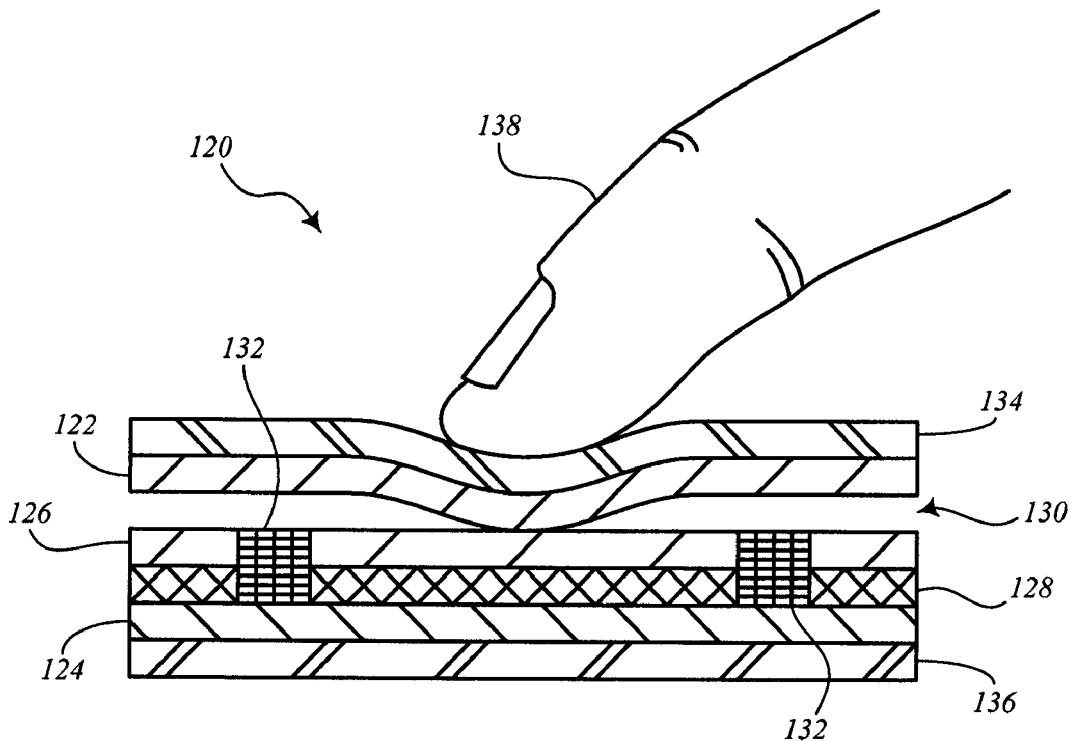
FIG. 8 is a diagram illustrating a cross-sectional side view of an example of a layered structure during use according to one embodiment.

FIG. 8 is a diagram illustrating an embodiment of a layered structure 120 in use. Layered structure 120 may include any suitable configuration, such as any one of the examples illustrated in the embodiments of FIGS. 3-7 or others. In the embodiment of FIG. 8, layered structure 120 includes a first conductive layer 122, a second conductive layer 124, a third conductive layer 126, an actuation layer 128, and a spacing layer 130. Third conductive layer 126 and actuation layer 128 are divided into regions separated by insulating material 132. Layered structure 120 further includes a first protective layer 134 and a second protective layer 136. From top to bottom, layered structure 120 comprises first protective layer 134, first conductive layer 122, spacing layer 130, third conductive layer 126, actuation layer 128, second conductive layer 124, and second protective layer 136.

Pressure can be applied to the top of first protective layer 134 by a user 138, represented in FIG. 8 as the user's finger. Because of the flexibility of at least first protective layer 134 and first conductive layer 122, first conductive layer 122 is able to be brought into contact with third conductive layer 126 within an area bounded by insulating material 132. Specifically, first conductive layer 122 bends enough to bridge the gap formed by spacing layer 130 to touch third conductive layer 126. Current signal i(t) from power source 14, 24 flows in the circuit comprising first conductive layer 122, third conductive layer 126, actuation layer 128, and second conductive layer 124.

A current, such as a sinusoidal current, flowing through actuation layer 128 cause the electrically-sensitive material of actuation layer 128 to vibrate. User 138 may be able to sense this vibration since actuation layer 128 responds immediately to the initial current, without the need for additional sensing and processing.

Figure 9A:
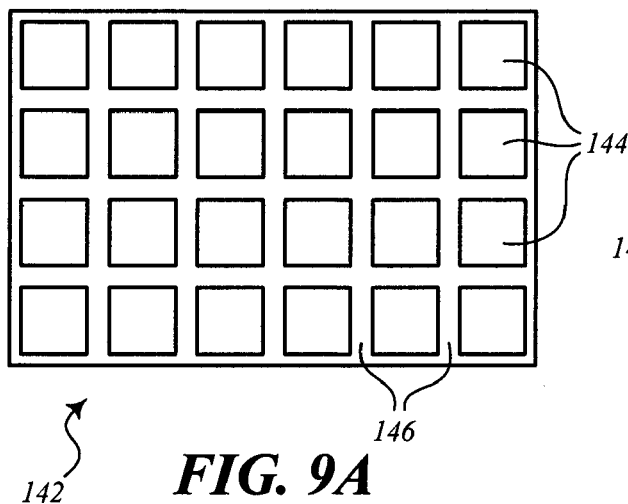
FIGS. 9A and 9B are diagrams illustrating the structure of electrically isolated regions of the third conductive layers and/or the actuation layers shown in FIGS. 3-7 according to two embodiments.
Figure 9B:
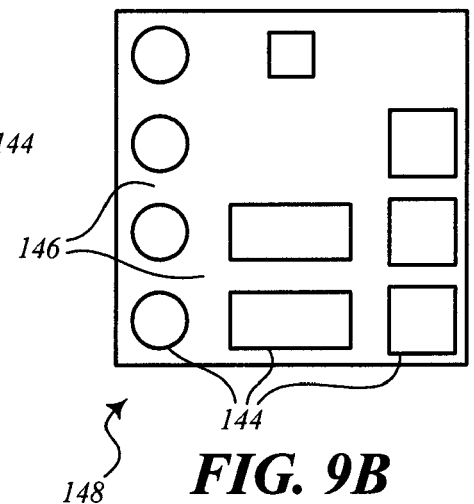

FIGS. 9A and 9B are diagrams illustrating a top view of embodiments of one or more layers of a layered structure having isolated regions. As explained above with respect to the embodiments of FIGS. 5-7, the actuation layers and/or third conductive layers can include any number of electrically isolated regions corresponding to areas that can be pressed. FIG. 9 can represent the isolated regions of the third conductive layer shown in FIG. 5 and can represent the isolated regions of the actuation layer shown in FIG. 7. Also, FIG. 9 can represent the isolated regions of both the third conductive layer and actuation layer shown in FIG. 6. In addition to the isolated regions embedded within the layers of the layered structure, an upper or top layer, such as the first conductive layer or first protective layer, can also include any suitable type of printed pattern showing the separate areas for indicating to the user where pressure is to be applied for certain types of inputs.

In FIG. 9A, layer 142, which represents an actuation layer, third conductive layer, or both, includes a 6×4 array of isolated regions 144 comprising square-shaped sections of conductive or semi-conductive material. Isolated regions 144 are separated from each other by non-conductive insulating material 146. In FIG. 9B, layer 148, representing an actuation layer, third conductive layer, or both, also includes isolated regions 144 comprising conductive or semi-conductive material, which are isolated from each other by insulating material 146. Isolated regions 144 in the embodiment of FIG. 9B can have any suitable shape, such as circular, square, rectangular, etc. Also, isolated regions 144 in FIG. 9B can have any size and are not necessarily formed in a grid type pattern as in FIG. 9A.

These and other possible configurations of isolated regions can be designed depending on the particular need and types of "buttons" or inputs that are to be used. Particularly, by including a number of isolated regions on one layered structure, these embodiments might be useful for a keypad-type mechanism or other similar input entry device. In some embodiments, however, the layered structures with multiple isolated regions may be diced during manufacture to separate each region into single buttons or keys. Alternatively, single buttons or keys may include regions that can be manufactured separately such that dicing would not be needed, such as in the embodiments of FIGS. 3 and 4.

In one example of an application of single buttons, it may be desirable to place specific types of buttons on the dashboard of a car to make it easier for a user to touch different buttons in different locations. However, in some examples, it may be desirable to include the buttons in an array (FIG. 9A) or some other configuration (FIG. 9B) to position the buttons in the same general location, such as for a raster display or other similar type of device.

Figure 10:
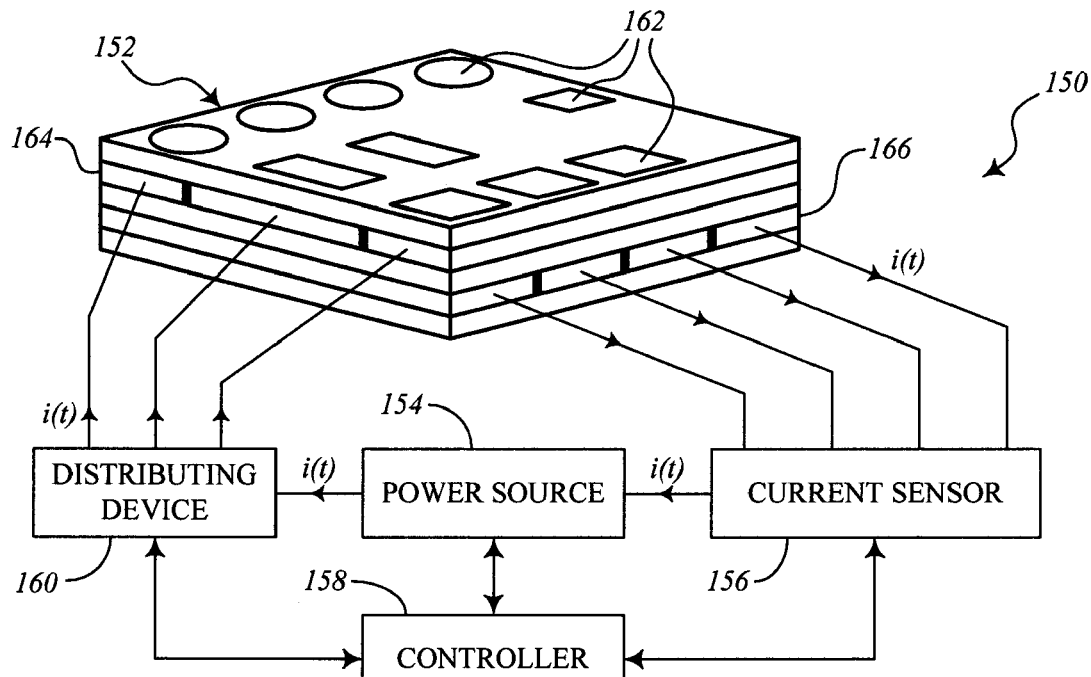
FIG. 10 is a diagram illustrating a direct haptic feedback system according to a third embodiment.

FIG. 10 illustrates a third embodiment of a direct haptic feedback system 150. In this embodiment, direct haptic feedback system 150 includes a layered structure 152 and a power source 154 similar to the embodiment of FIG. 1. In addition, however, direct haptic feedback system 150 includes a current sensor 156 and a controller 158 similar to the embodiment of FIG. 2. Furthermore, layered structure 152 comprises a distributing device 160. This embodiment includes multiple pressing regions 162 with corresponding isolated regions of one or more layers embedded within layered structure 152. Layered structure 152 comprises, among other layers, a first conductive layer 164 having multiple strips running in one direction and a second conductive layer 166 having multiple strips running in a substantially perpendicular direction. It should be noted that each of the strips of the conductive layers are electrically isolated from the other strips on that layer.

Controller 158 controls power source 154 and distributing device 160 to provide the electric current signal i(t) to each of the different strips of first conductive layer 164 one at a time according to a predetermined sequence. Power source 154 thus stimulates one strip at a time and current sensor 156 is able to monitor the strips of second conductive layer 166 to determine the presence or magnitude of a current on these strips. Based on the combination of the stimulated strip in first conductive layer 164 and the simultaneous sensing of current at one or more strips of second conductive layer 166, the location of the pressure on the top of layered structure 152 can be pinpointed. Direct haptic feedback system 150 can not only provide immediate haptic feedback to the user, but also can determine which pressing region or regions 162 have been pressed. Based on the determination of which regions have been pressed, controller 158 can control the power source 154 and distributing device 160 to provide a predefined stimulus to the actuation layer of the particular pressed region to activate the electrically sensitive material.

Figure 11:
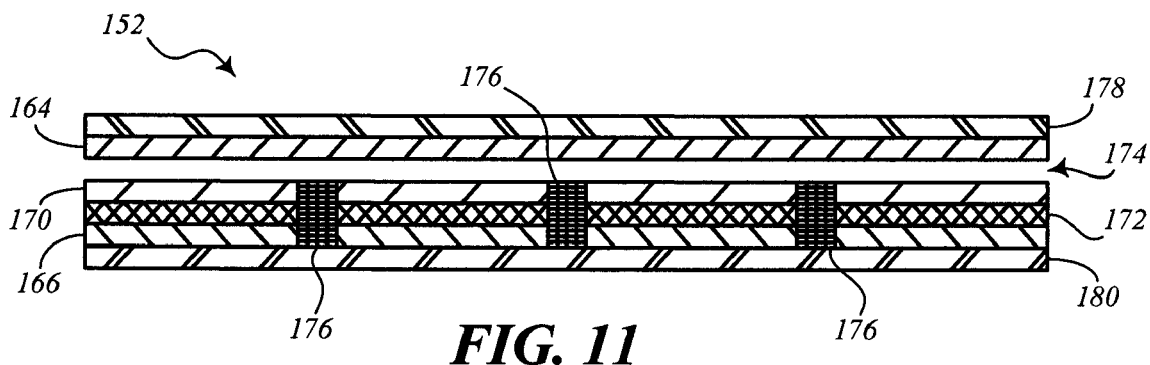
FIG. 11 is a diagram illustrating a cross-sectional side view of an example of the layered structure shown in FIG. 10 according to one embodiment.

FIG. 11 illustrates an embodiment of layered structure 152 shown in FIG. 10. Layered structure 152 in this embodiment includes first conductive layer 164 and second conductive layer 166, as shown in FIG. 10. In addition, layered structure 152 includes third conductive layer 170, actuation layer 172, and spacing layer 174. Each region of third conductive layer 170, actuation layer 172, and second conductive layer 166 is separated from the other regions of their respective layers by insulating material 176. Although not shown in FIG. 11, insulating material 176 also electrically isolates conductive strips of first conductive layer 164. The strips and insulating material 176 in first conductive layer 164 are oriented in a direction substantially perpendicular to the strips and insulating material 176 in second conductive layer 166.

Figure 12:
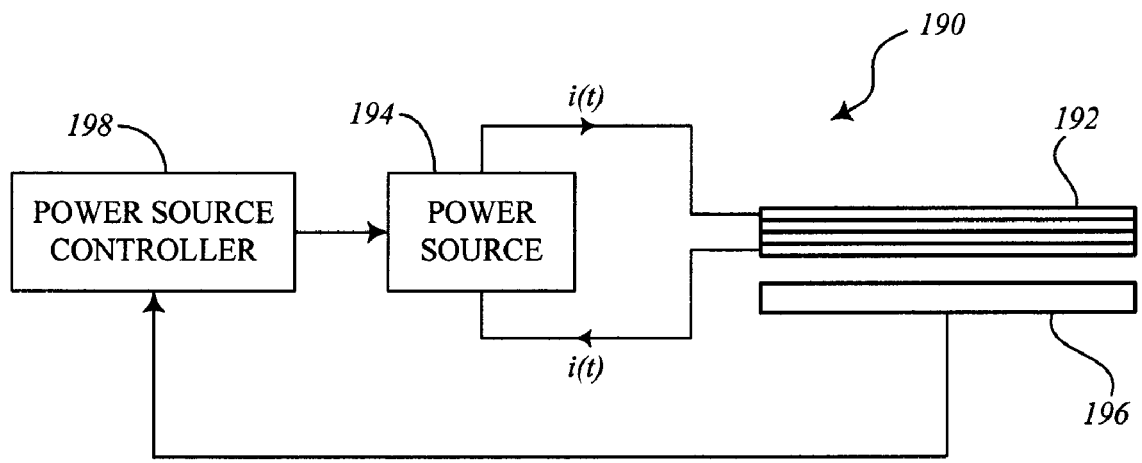
FIG. 12 is a diagram illustrating a direct haptic feedback system according to a fourth embodiment.

FIG. 12 illustrates a fourth embodiment of a direct haptic feedback system 190. In this embodiment, direct haptic feedback system 190 includes a layered structure 192 and a power source 194 similar to the embodiment of FIGS. 1, 2, and 10. However, this embodiment also includes a position sensing device 196 and a power source controller 198. Position sensing device 196 can be designed and managed independently from layered structure 192. In some embodiments position sensing device 196 may be near or in contact with layered structure 192. When in contact with each other, position sensing device 196 may be positioned on top of or on the bottom of layered structure 192. Position sensing device 196 senses the position on the two-dimension surface of the device where pressure is applied.

Furthermore, output signals from position sensing device 196 can be transmitted to power source controller 198 to relay information about where pressure has been applied. In response, power source controller 198 controls power source 194 as mentioned with respect to the other embodiments involving power source controllers.

In some embodiments, position sensing device 196 can be a touch screen device, such as a resistive or capacitive type touch screen device, having a display or other light source. In this case, the layers of layered structure 192 may be made of translucent or transparent materials and placed over the display without significantly affecting the quality of the image. For example, layered structure 192 may be placed on a computer monitor, touch screen, or other type of display device. With position sensing device 196 in use in direct haptic feedback system 190, position sensing device 196 can sense the position of the touch and layered structure 192 can provide the haptic feedback.

Position sensing device 196 could be located on the top or bottom of layered structure 192 and can therefore be either film-on-film or film-on-glass, depending on the particular application or size. In order for the top layers to be able to bend enough to translate the pressure from the top layers to the opposite side, protective layers of either position sensing device 196 or layered structure 192 should be flexible. For example, in the case where layered structure 192 is placed on top of position sensing device 196, all layers of layered structure 192 should be able to bend enough such that pressure applied to the top of layered structure 192 is translated to position sensing device 196. In this example, position sensing device 196 may be include a film-on-glass structure to provide sufficient support at the bottom of the combined structure. On the other hand, if layered structure 192 is located below position sensing device 196, position sensing device 196 may be configured as a film-on-film structure and the bottom protective layer of layered structure 192 may comprise a rigid material.

Figure 13:
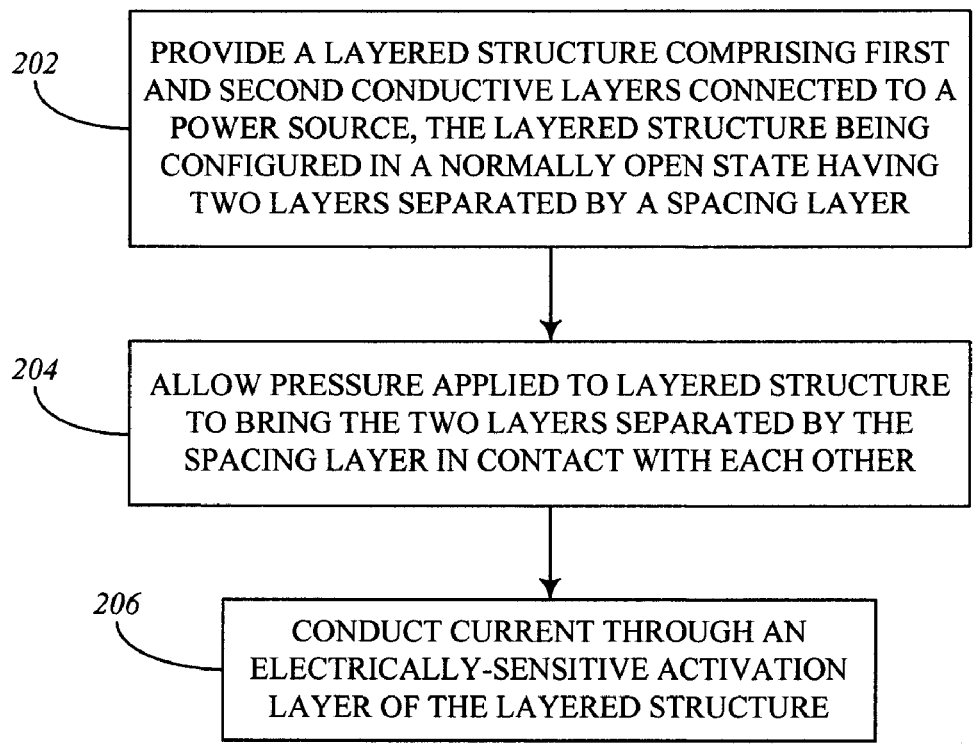
FIG. 13 is a flow diagram illustrating a method for directly applying a haptic effect according to a first embodiment.

FIG. 13 is a flow diagram illustrating a first embodiment of a method for providing immediate haptic feedback to a user of a layered structure. As indicated in block 202, a layered structure is provided. The layered structure comprises first and second conductive layers electrically coupled to a power source. The layered structure is configured in a normally open electrical state having two layers separated by a spacing layer. As indicated in block 204, the method allows a pressure to be applied to the layered structure to bring the two layers normally separated by the spacing layer in contact with each other. In response to the two layers being brought into contact, a current is conducted through an electrically-sensitive actuation layer of the layered structure, as indicated in block 206. The current flowing through the actuation layer causes the actuation layer to react, e.g., vibrate. Since current can be conducted as soon as the circuit is complete, the reaction of the actuation layer is substantially immediate, thereby providing immediate haptic feedback to the user.

Figure 14:
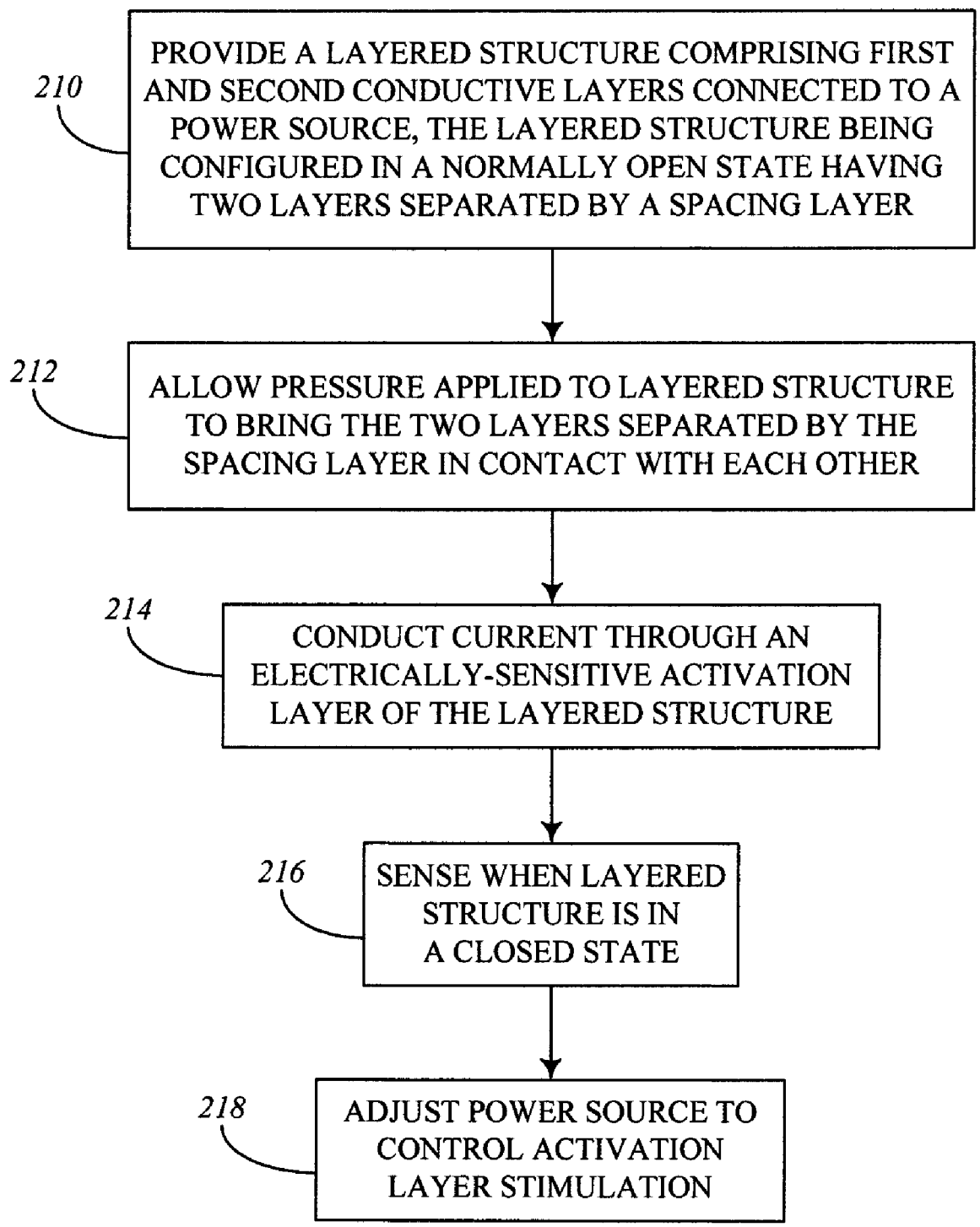
FIG. 14 is a flow diagram illustrating a method for directly applying a haptic effect according to a second embodiment.

FIG. 14 is a flow diagram illustrating a second embodiment of a method for providing immediate haptic feedback to a user of a layered structure. Blocks 210, 212, and 214 of FIG. 14 are similar to blocks 202, 204, and 206 of FIG. 13 and are therefore not repeated for the sake of brevity. In addition, the method of FIG. 14 includes sensing when the layered structure is in a closed electrical state, as indicated in block 216. This can be accomplished using a current sensor to detect when current flows through the circuit comprising the power source and layered structure. According to block 218, the power source is adjusted to control the stimulation current to the actuation layer. For example, the power source can be controlled to decay the stimulus signal to the actuation layer or stop the signal after a predetermined length of time. Also, the power source can be controlled to have a predetermined constant or varying magnitude over any length of time.

Figure 15:
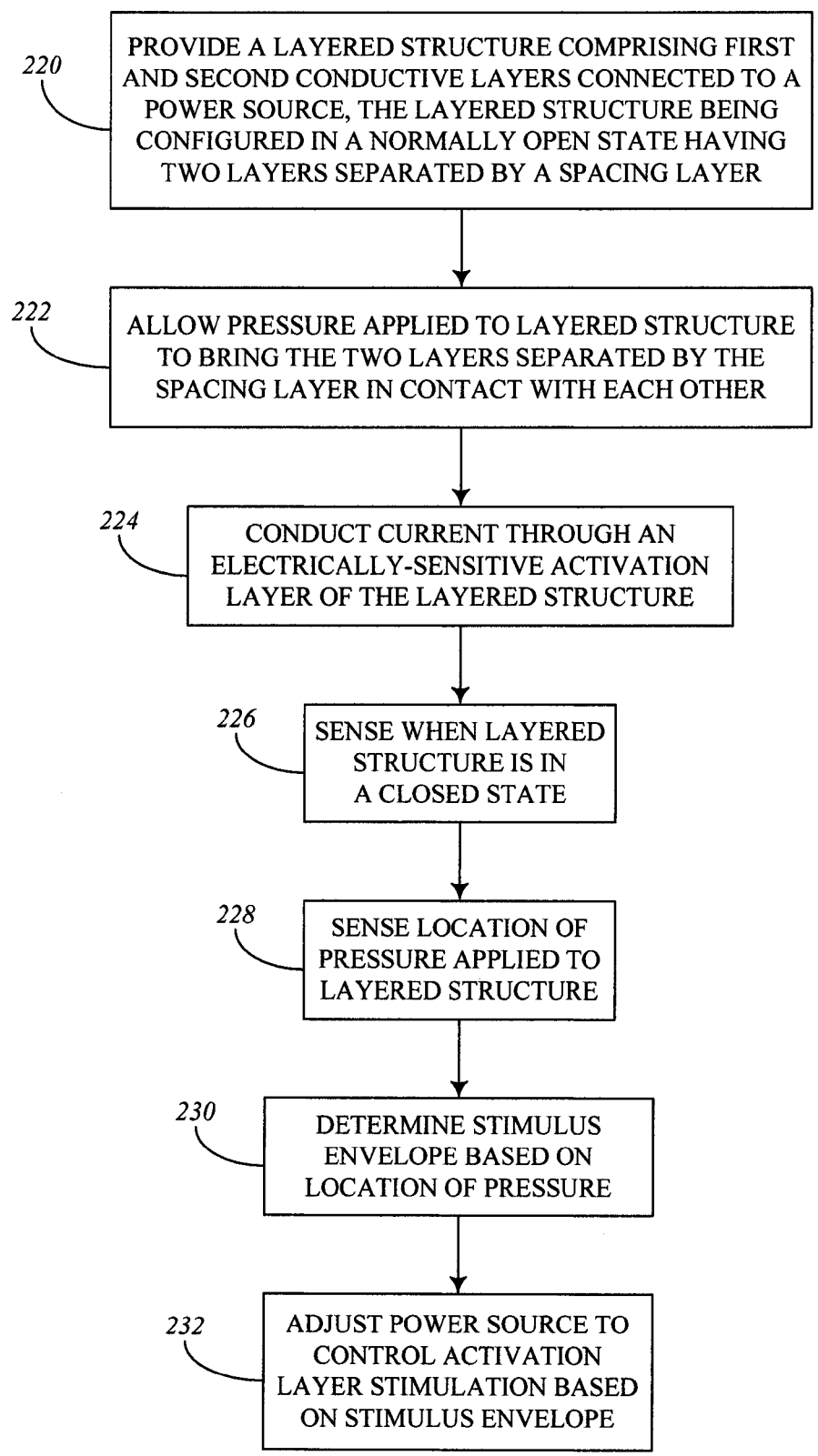
FIG. 15 is a flow diagram illustrating a method for directly applying a haptic effect according to a third embodiment.

FIG. 15 is a flow diagram illustrating a third embodiment of a method for providing immediate haptic feedback to a user of a layered structure. Blocks 220, 222, and 224 of FIG. 15 are similar to blocks 202, 204, and 206 of FIG. 13 and thus are not repeated for the sake of brevity. In addition, the method of FIG. 15 includes sensing when the layered structure is in a closed electrical state, as indicated in block 226, which in some cases can be performed by a current sensor. As indicated in block 228, the location of the pressure applied to the layered structure is sensed. This can be accomplished by applying current to one strip at a time of a number of strips in a conductive layer and simultaneously sensing current from one or more strips of another conductive layer.

As indicated in block 230, the method further comprises determining a stimulus envelope based on the location of the applied pressure. For example, the stimulus envelope can be determined based on certain haptic effects to be imposed on the user for different types of regions that can be pressed. As indicated in block 232, the power source is adjusted to control the stimulus signal to the actuation layer based on the determined stimulus envelope.

It should be understood that the routines, steps, processes, or operations described herein may represent any module or code sequence that can be implemented in software or firmware. In this regard, these modules and code sequences can include commands or instructions for executing the specific logical routines, steps, processes, or operations within physical components. It should further be understood that two or more of the routines, steps, processes, and/or operations described herein may be executed substantially simultaneously or in a different order than explicitly described, as would be understood by one of ordinary skill in the art.

The embodiments described herein represent a number of possible implementations and examples and are not intended to necessarily limit the present disclosure to any specific embodiments. Instead, various modifications can be made to these embodiments as would be understood by one of ordinary skill in the art. Any such modifications are intended to be included within the spirit and scope of the present disclosure and protected by the following claims.

I claim:

1. A haptic feedback system comprising:
a structure including a first conductive layer, a spacing layer, an actuation layer, a second conductive layer, and a third conductive layer formed between the first conductive layer and the second conductive layer, the third conductive layer also being formed between the spacing layer and the actuation layer, the actuation layer being sensitive to electrical current, at least one of the layers being sufficiently flexible to bend when a pressure is applied to the structure, the first conductive layer and the second conductive layer being normally separated by the spacing layer;
a power source electrically coupled to the first conductive layer and the second conductive layer;
wherein a normally open electrical circuit is formed from the structure and the power source;
wherein, when an adequate pressure is applied to the structure to bring the first conductive layer and the second conductive layer into contact with each other, the electrical circuit is completed, allowing the current to flow through the structure and causing the actuation layer to provide a haptic effect.

2. The haptic feedback system of claim 1, further comprising a current sensor electrically coupled between the power source and one of the conductive layers, the current sensor configured to sense when the electrical circuit is completed.

3. The haptic feedback system of claim 2, further comprising a power source controller, wherein the current sensor indicates to the power source controller when the electrical circuit is completed.

4. The haptic feedback system of claim 3, wherein, in response to receiving an indication from the current sensor, the power source controller is configured to cause the power source to supply a predetermined current envelope to the structure.

5. The haptic feedback system of claim 4, wherein the predetermined current envelope includes a signal that decays to substantially zero after a predetermined length of time.

6. The haptic feedback system of claim 4, wherein the current sensor detects a magnitude of the current flowing through the electrical circuit and indicates the magnitude of the detected current to the power source controller, and wherein the power source controller selects one of a plurality of predetermined current envelopes to supply to the structure based on the magnitude of the detected current.

7. The haptic feedback system of claim 2, further comprising a distributing device and a controller, wherein the distributing device is electrically coupled between the power source and the first conductive layer and the controller is electrically coupled to each of the distributing device, power source, and current sensor.

8. The haptic feedback system of claim 7, wherein the first conductive layer comprises a first set of strips of conductive material and the second conductive layer comprises a second set of strips of conductive material, and wherein the first set of strips are positioned in a first direction and the second set of strips are positioned in a second direction that is substantially perpendicular to the first direction.

9. The haptic feedback system of claim 8, wherein the distributing device is configured to supply power from the power source to the first set of strips one strip at a time, and wherein the current sensor is configured to sense when current flows through one or more strips of the second set of strips.

10. The haptic feedback system of claim 9, wherein the controller is configured to cause the power source and distributing device to supply current to a strip of the first set of strips according to a predetermined decay envelope.

11. The haptic feedback system of claim 1, further comprising a position sensing device configured to determine where pressure is the applied to the structure.

12. The haptic feedback system of claim 11, further comprising a power source controller configured to control the output of the power source based on where the pressure is applied to the structure.

13. The haptic feedback system of claim 11, wherein the position sensing device includes a film-on-glass construction and the structure is positioned on top of the position sensing device.

14. The haptic feedback system of claim 11, wherein the position sensing device includes a film-on-film construction and is positioned on top of the structure.

15. The haptic feedback system of claim 1, wherein the power source is configured to supply a sinusoidal current to the structure.

16. A layered structure comprising:
 a first conducting layer electrically coupled to a first terminal of a power source;
 a second conducting layer electrically coupled to a second terminal of the power source;
 a third conductive layer formed between the first conductive layer and the second conductive layer;
 a spacing layer electrically isolating the first conducting layer from the second conducting layer; and
 an actuation layer positioned between the first conducting layer and the second conducting layer;
 wherein the actuation layer includes a material that reacts to an electrical stimulus; and
 wherein the third conductive layer is formed between the spacing layer and the actuation layer.

17. The layered structure of claim 16, wherein the first conducting layer is sufficiently flexible such that a pressure applied to the first conducting layer causes the first conducting layer to come into contact with the actuation layer.

18. The layered structure of claim 16, wherein the actuation layer is positioned adjacent to the second conducting layer and is electrically isolated from the first conducting layer by the spacing layer.

19. The layered structure of claim 16, wherein the actuation layer is positioned adjacent to the first conducting layer and is electrically isolated from the second conducting layer by the spacing layer.

20. The layered structure of claim 16, further comprising a first protective layer formed adjacent to the first conducting layer to protect the first conducting layer.

21. The layered structure of claim 20, further comprising a second protective layer formed adjacent to the second conducting layer to protect the second conducting layer.

22. The layered structure of claim 21, wherein the second protective layer provides support for the layered structure.

23. The layered structure of claim 16, wherein the third conductive layer includes a first set of regions that are electrically insulated from each other and the actuation layer includes a second set of regions that are electrically insulated from each other, and wherein a first pattern formed by the first set of regions corresponds to a second pattern formed by the second set of regions.

24. The layered structure of claim 16, wherein the third conductive layer includes a plurality of regions that are electrically insulated from each other.

25. The layered structure of claim 16, wherein at least one of the third conductive layer and the actuation layer includes a plurality of regions that are electrically insulated from each other, the plurality of regions formed in an array corresponding to locations where a user can apply pressure.

26. The layered structure of claim 16, wherein the actuation layer includes a plurality of regions that are electrically insulated from each other.

27. The layered structure of claim 16, wherein the spacing layer causes a circuit formed by the layered structure and the power source to be a normally open circuit, the circuit being open by the spacing layer forming a gap in the circuit.

28. The layered structure of claim 27, wherein one or more of the layers are sufficiently flexible such that a pressure applied to the one or more layers causes the circuit to be complete by bridging the gap in the circuit.

29. The layered structure of claim 16, further comprising a plurality of spacing layers and a plurality of actuation layers.

30. A method comprising:
 providing a layered structure including first and second conductive layers electrically coupled to a power source, the layered structure further including an electrically-sensitive actuation layer and a third conductive layer formed between the first conductive layer and the second conductive layer, the layered structure being configured as a normally open circuit where the first and second conductive layers are normally separated by a spacing layer;
 allowing sufficient pressure to be applied to the layered structure to bring the first and second conductive layers normally separated by the spacing layer into contact with each other;
 and conducting current through the actuation layer when sufficient pressure is applied; and
 wherein the third conductive layer is formed between the spacing layer and the actuation layer.

31. The method of claim 30, wherein at least one of the actuation layer and the third conductive layer includes a plurality of regions that are electrically insulated from each other.

32. The method of claim 30, wherein the layered structure further comprises one or more protective layers.

33. The method of claim 30, wherein the pressure is applied by a user.

34. The method of claim 33, wherein conducting current causes the actuation layer to provide a haptic effect to the user.

35. The method of claim 30, wherein conducting current includes conducting an alternating current.

36. The method of claim 35, wherein conducting the alternating current through the actuation layer causes at least a portion of the actuation layer to vibrate.

37. The method of claim 30, further comprising: sensing when the layered structure is in a closed circuit state;
 and adjusting the output of the power source to control the activation characteristics of the actuation layer.

38. The method of claim 37, wherein adjusting the output of the power source includes applying a predetermined decaying envelope to the output, the decaying envelope having a magnitude that drops to substantially zero after a predetermined length of time.

39. The method of claim 30, further comprising:
 sensing when the layered structure is in a closed circuit state;
 sensing a location where pressure is applied to the layered structure;
 determining a stimulus envelope based on the location where the pressure was applied; and
 adjusting the output of the power source to control the stimulation characteristics of the actuation layer based on the stimulus envelope.

40. The method of claim 39, wherein sensing location where pressure is applied further comprises:
 applying input signals one at a time to a plurality of electrically isolated strips of the first conductive layer;
 and sensing output signals from one or more of a plurality of electrically isolated strips of the second conductive layer;
 wherein the strips of the first conductive layer are positioned in a first direction and the strips of the second conductive layer are positioned in a second direction that is substantially perpendicular to the first direction; and
 wherein the combination of a first location of the stimulated strip of the first conductive layer and a location of the one or more strips of the second conductive layer where output signals are sensed is indicative of a general location where pressure is applied.

* * * * *